(12) United States Patent
You et al.

(10) Patent No.: US 6,259,115 B1
(45) Date of Patent: Jul. 10, 2001

(54) DUMMY PATTERNING FOR SEMICONDUCTOR MANUFACTURING PROCESSES

(75) Inventors: Lu You, Santa Clara; Simon S. Chan, Saratoga; Kai Yang, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/262,214

(22) Filed: Mar. 4, 1999

(51) Int. Cl.[7] ............................................. H01L 21/56
(52) U.S. Cl. ........................... 257/48; 257/170; 257/354
(58) Field of Search ............................ 257/48, 170, 354, 257/401, 409, 773, 758; 438/227, 183, 231

(56) References Cited

U.S. PATENT DOCUMENTS

| 5,598,010 | * | 1/1997 | Uematsu | 257/48 |
| 5,625,232 | * | 4/1997 | Numata et al. | 257/758 |
| 5,994,179 | * | 11/1999 | Masuoka | 438/227 |

* cited by examiner

*Primary Examiner*—Matthew Smith
*Assistant Examiner*—V. Yevsikov
(74) *Attorney, Agent, or Firm*—Mikio Ishimaru

(57) ABSTRACT

A method is provided for inserting dummy conductive channels along with the interconnected conductive channels. The dummy channels have an approximately even metal weight distribution to provide better plating uniformity, minimize CMP dishing, improve process heating uniformity, improve spin-on process properties, and increase etch and lithography uniformity.

10 Claims, 2 Drawing Sheets

DUMMY PATTERNING FOR SEMICONDUCTOR MANUFACTURING PROCESSES

TECHNICAL FIELD

The present invention relates generally to the manufacture of semiconductors and more specifically to improving planarity in semiconductor processes.

BACKGROUND ART

While manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The first damascene step photoresist is stripped. An optional thin adhesion layer of barrier material is deposited to coat the walls of the first channel opening to ensure good adhesion and electrical contact of subsequent layers to the underlying semiconductor devices. A barrier layer is then deposited on the adhesion layer to improve the formation of subsequently deposited conductive material and to act as a barrier material to prevent diffusion of such conductive material into the oxide layer and the semiconductor devices (the combination of the adhesion and barrier material is collectively referred to as "barrier layer" herein). It should be noted that some barrier materials also have good adhesion, which is why the adhesion layer is optional. A "seed" layer is then deposited to act as a seed for additional conductive material to be deposited. A first conductive material is then deposited. For deposition of the adhesion, barrier, seed, and conductive materials, the deposition processes require uniform heating of the silicon substrate. These materials are then subjected to a planarizing chemical-mechanical polishing (CMP) process which removes the layers of material above the first channel oxide layer and damascenes the first conductive material in the first channel openings to form the first channels.

For multiple layers of channels, another metalization process, which is called the "dual damascene" technique, is used in which the channels and vias are formed at the same time. In one example, the via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and the via openings to form the second channel and the via. Again, for these deposition processes the silicon substrate should be uniformly heated. A second planarizing chemical mechanical polishing process leaves the two vertically separated, horizontally perpendicular channels connected by cylindrical vias.

The use of the damascene techniques eliminates metal etch and dielectric gap fill steps typically used in the conventional metalization process. The elimination of metal etch steps is important as the semiconductor industry moves from aluminum to other metalization materials, such as copper, which are very difficult to etch.

At the same time, there are a number of drawbacks to the damascene and dual damascene processes which are due to the generally uneven distribution of the pattern of the conductive channels. Often, there are many channels in one location and few in others. This means that during the chemical-mechanical-polishing processes, the areas where there are many channels tends to be relatively planar while those areas with fewer channels tend to be less planar, or dished out, because the dielectric is more easily polished than the conductive material. In addition, the irregular spacing of the channels adversely affects the spin-on deposition processes, such as those often used for the dielectric depositions in Al based metalizations. The drawbacks of the damascene and dual damascene technique have long plagued the industry.

Also, when the various deposition steps are being performed, after the first channels had been deposited, it is desirable that the temperature of the silicon substrate be uniform. However, the conductive material in the non-uniformly placed channels tends to cause irregular heating, which is detrimental to the deposition processes.

As the industry moves to smaller and smaller device sizes and harder materials than aluminum, it has become more critical that answers be found to these problems.

DISCLOSURE OF THE INVENTION

The present invention provides a technique of inserting dummy conductive channels by a weight-balancing technique to have an approximately even metal weight distribution across the silicon substrate.

The present invention provides for inserting dummy conductive channels to improve conductive material plating uniformly.

The present invention further provides for the insertion of dummy conductive channels to reduce chemical-mechanical-polishing dishing and thereby improving polishing planarity.

The present invention further provides for the insertion of dummy conductive material channels to improve heating uniformity for chemical and physical vapor deposition processes.

The present invention further provides for the insertion of dummy conductive channels on a silicon substrate to improve spin-on process properties.

The present invention further provides for the insertion of dummy conductive material channels to improve etch and photolithography uniformity.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
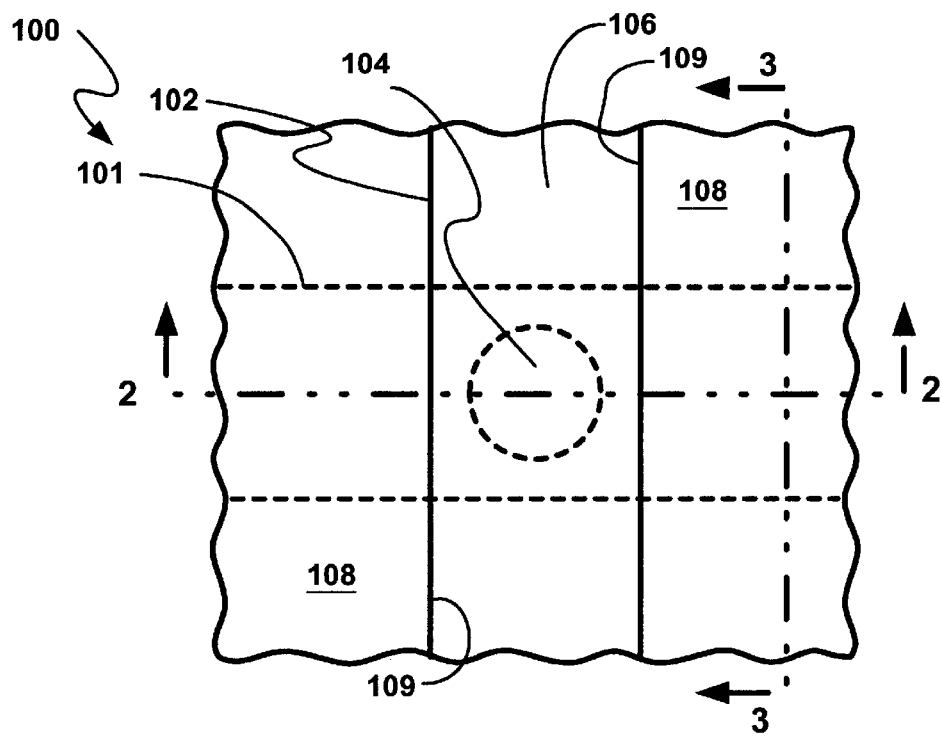
FIG. 1 (PRIOR ART) is a plan view of aligned channels with a prior art via.

Referring now to FIG. 1 (PRIOR ART), therein is shown a plan view of a prior art pair of the perpendicularly aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel 101 contains the conductive material. The second channel 102 is formed by filling a second channel opening 106 disposed in a second channel oxide layer 108 with the conductive material. The oxide layers are generally of silicon dioxide ($SiO_2$). The second channel opening 106 is defined by walls (sidewalls) 109 of the second channel dielectric 108.

Figure 2:
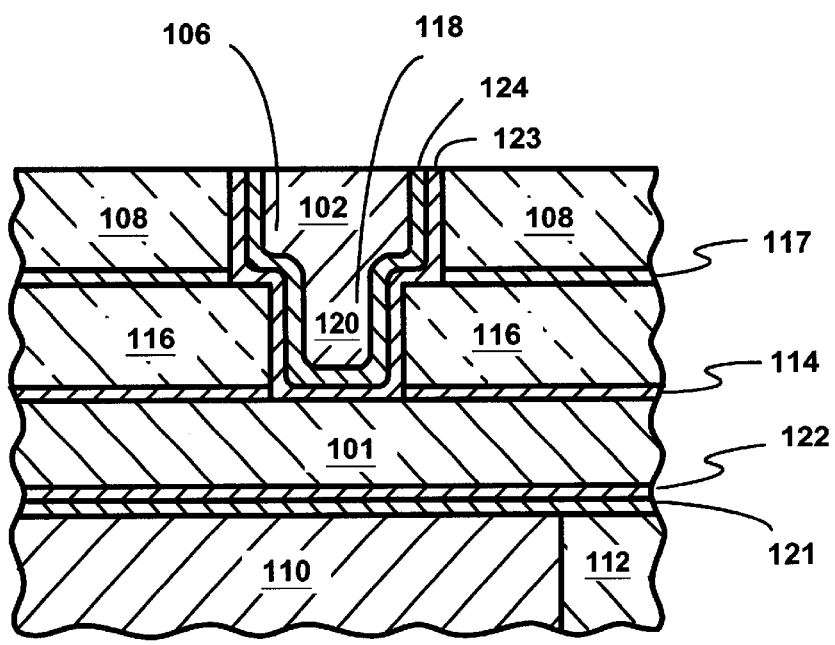
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The conventional nitride layer is composed of a compound of silicon nitride (SiN). The cross-sectional area of the round via 104 of FIG. 1 (PRIOR ART) defines a cylindrical via 120 when it is filled with the conductive material. Also shown disposed around the first channel 101 is a barrier layer 121 and a seed layer 122, and around the second channel 102 and the cylindrical via 120 is a barrier layer 123 and a seed layer 124.

Figure 3:
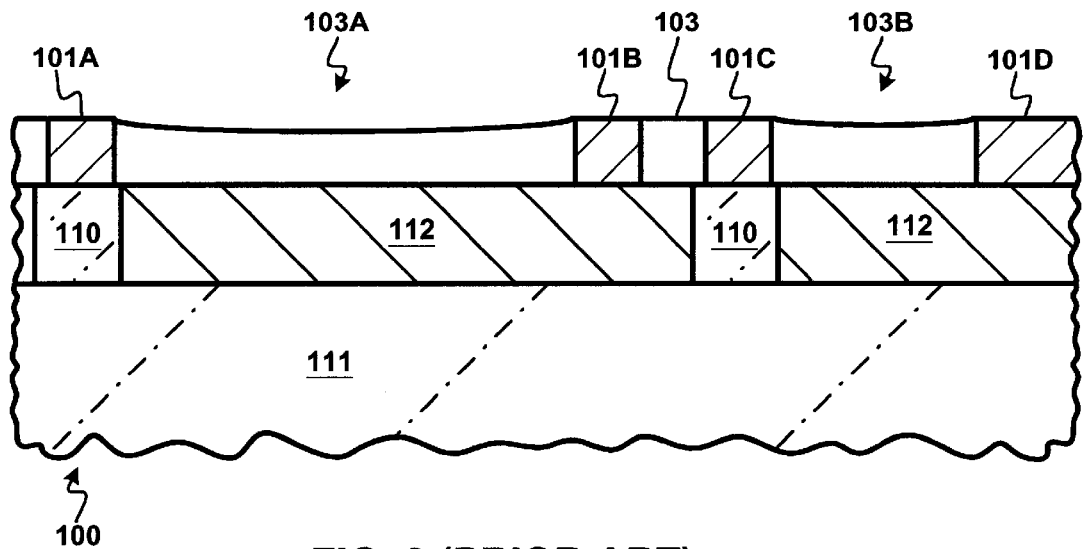
FIG. 3 (PRIOR ART) is a cross-section of a silicon substrate in an intermediate state of processing showing the prior art interconnected conductive channel distribution.

Referring now to FIG. 3 (PRIOR ART), therein is shown a cross-section of the semiconductor wafer 100 with the semiconductor substrate 111 having disposed thereon the polysilicon gates 110 and the dielectric 112. Disposed on top of the polysilicon gates 110 and the dielectric 112 are first channels 101A, 101B, 101C, and 101D. It should be noted that these channels are irregularly spaced. The first channels 101A and 101C are shown interconnected to the polysilicon gates 110. Disposed among the first channels 101 A through 101D is the first channel dielectric, or oxide layer, 103. The semiconductor wafer 100 is shown after chemical-mechanical polishing (CMP) which leaves dishing at dished out areas 103A and 103B in the first channel dielectric layer 103.

Figure 4:
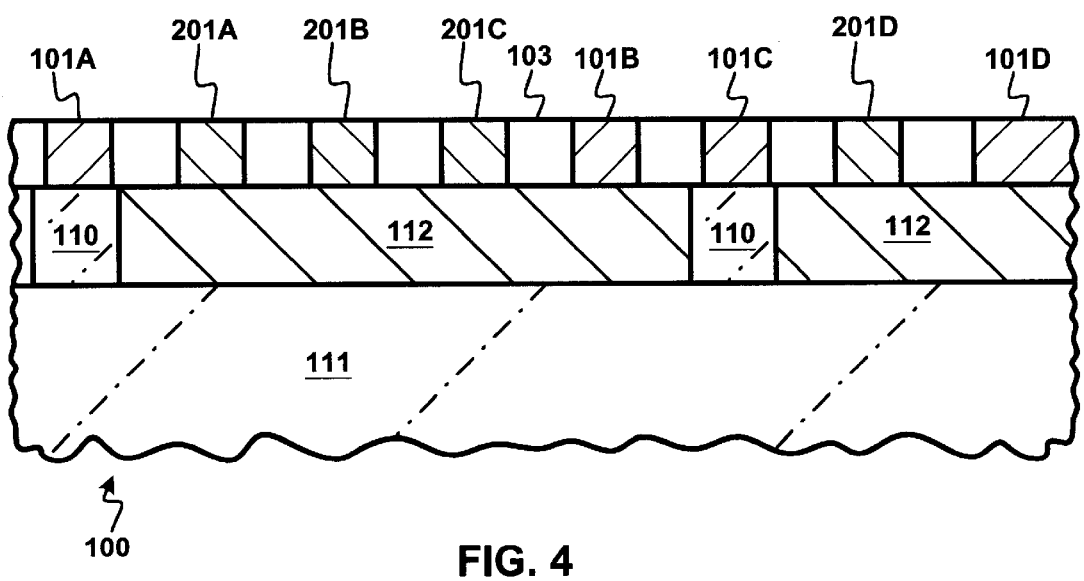
FIG. 4 is FIG. 3 with the insertion of the dummy pattern of channels of the present invention.

Referring now to FIG. 4, therein is shown the dummy patterning of the present invention. The dummy channels 201A through 201C are inserted between the first channels 101 A and 101 B. Similarly, the dummy channel 201 D is patterned between the first channels 101C and 101D. All the numbers in FIG. 4 are the same for the same elements as in FIG. 3. The dummy channels are most easily made of the same conductive materials as the first channels and may be deposited at the same time.

It should be noted that the surface of the dielectric 103 is highly planar in FIG. 4 with no evidence of the dishing 103A or 103B. It is also noted that metal channals also have dishings (not shown in FIG. 3). With dummy patterns added, these metal dishings will be reduced.

In production in the past, a conventional first damascene process was used to put down the first channel 101 in the first channel oxide layer 103 over a production semiconductor wafer 100. The damascene process is a photolithographic process which uses a mask to define a first channel opening (not shown) in the first channel oxide layer 103. The first channel opening is then filled with the thin barrier layer 121, the thin seed layer 122, and the first conductive material, such as copper, to form the first channel 101 using conventional metal deposition techniques, such as physical vapor deposition, chemical vapor deposition, electroplating, or a combination thereof.

After deposition of the first conductive material, the top surface is then subject to CMP to remove the adhesive material, barrier material, seed material, and conductive material outside of the first channel opening such that the first channel oxide layer 103 is exposed. Without the dummy channels inserted by the dummy patterning along with the first channels, the dishing 103A and 103B would occur which would be detrimental to the following steps in processing additional levels of channels. In the present invention, the dummy channels 201A through 201D maintain the planarity of the surface of the first channel oxide layer 103. This means the following process steps are performed on a highly planar surface.

The dummy channels 201A through 201D permit a uniform deposition of via photoresist to be spun on which provides a more planar surface for the via photolithographic process to be performed so as to create more uniform channels. This improves the photolithographic process which in turn improves the etching of the channel openings.

For the second channel 102, the stop nitride layer 114, the via oxide layer 116, and the via nitride layer 117 would be successively deposited on top of the first channel 101 and the first channel oxide layer 112 using conventional deposition techniques.

By using the via photoresist and the via photolithographic process followed by nitride etching of a round via opening 104 in the via nitride layer 117, the basis for the cylindrical via 118 was formed. The subsequent deposition of the second channel oxide layer 108 prepared the way for the second channel 102 to be perpendicular to the first channel 101.

The second damascene process is also a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 2 than in the horizontal direction. The nitride etch of the stop nitride layer 114 exposes a portion of the first channel 101 and completes the etching steps. The second channel opening 106 is then filled with the thin barrier layer 123, the thin seed layer 124, and the second conductive material. The second conductive material is also a conductor, such as copper, to form the second channel 102 using conventional metal deposition techniques, such as physical vapor deposition, chemical vapor deposition, electroplating, or a combination thereof.

Where metal deposition techniques such as physical vapor deposition or chemical vapor deposition are used, it is necessary to have a relatively uniform wafer temperature in order to achieve uniform deposition with good adhesion. In the prior art shown in FIG. 3 (PRIOR ART) there would be large temperature differentials due to the conductive nature of the conductive material. With the present invention, with uniform conductive channels the temperature differentials are minimized and thus the deposition of the metal deposition techniques is substantially improved.

At this point, another CMP process is used to level the second channel 102 in preparation for additional layers of channels, and again the dummy channels 201A through 201D help provide a planar surface for the second channel dielectric 108.

The dummy channels are positioned by weight for temperature stability purposes and by spacing for CMP purposes and photolithographic and spin-on purposes. The various non-dummy channels are interconnected to the semiconductor devices and to each other. The dummy channels could be interconnected to each other or just placed where desired and totally isolated from each other.

While the best mode utilizes copper as the conductive material, it should be understood that the present invention is applicable to conductive materials such as copper, aluminum, doped polysilicon, gold, silver, compounds thereof, alloys thereof, and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs, which involve filling an opening with conductive materials such as tungsten or aluminum, may be used to practice the present invention. For example, it is also applicable for the conventional Al interconnect technique in which metal patterns are etched, followed by dielectric gap filling and CMP While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An integrated circuit comprising:

a semiconductor substrate;

a semiconductor device disposed on said semiconductor substrate;

a device dielectric layer disposed on said semiconductor device;

a channel dielectric layer disposed over the device dielectric layer;

a conductive channel disposed in said channel dielectric layer connected to said semiconductor device; and a dummy channel disposed in said channel dielectric layer unconnected to said conductive channel whereby top surfaces of said channel dielectric layer, said conductive channel, and said dummy channel are coplanar without erosion or dishing.

2. The integrated circuit claimed in claim 1 wherein said dummy channel is substantially equidistantly spaced in said channel dielectric layer from said conductive channel.

3. The integrated circuit as claimed in claim 1 wherein said dummy channel is evenly dispersed in said channel dielectric layer with said conductive channel.

4. The integrated circuit as claimed in claim 1 wherein said dummy channel is equally balanced in said channel dielectric layer in weight and distribution as said conductive channel.

5. The integrated circuit as claimed in claim 1 wherein said conductive channel and said dummy channel are of a conductive material selected from a group consisting of copper, aluminum, doped silicon, gold, silver, a compound thereof, and a combination thereof.

6. An integrated circuit comprising:

a semiconductor substrate;

a plurality of semiconductor devices disposed on said semiconductor substrate;

a device dielectric layer disposed on said semiconductor devices;

a channel dielectric layer disposed over said device dielectric layer;

a plurality of interconnected conductive channels disposed in said channel dielectric layer connected to different ones of said plurality of said semiconductor devices; and a plurality of dummy channels disposed in said channel dielectric layer unconnected to said interconnected channels.

7. The integrated circuit claimed in claim 6 wherein said plurality of dummy channels are substantially equidistantly spaced in said channel dielectric layer from said plurality of interconnected channels and inter-lineated therewith.

8. The integrated circuit as claimed in claim 6 wherein said plurality of dummy channels is evenly dispersed in said channel dielectric layer with said plurality of interconnected channels.

9. The integrated circuit as claimed in claim 6 wherein said plurality of dummy channel is equally balanced in said channel dielectric layer in weight and distribution as said plurality of interconnected channels.

10. The integrated circuit as claimed in claim 6 wherein said plurality of interconnected channels and said plurality of dummy channels are of conductive materials selected from a group consisting of copper, aluminum, doped silicon, gold, silver, a compound thereof, and a combination thereof.

* * * * *